United States Patent
Miyazaki

(10) Patent No.: US 10,208,400 B2
(45) Date of Patent: Feb. 19, 2019

(54) METHOD FOR MANUFACTURING SILICON CARBIDE SEMICONDUCTOR DEVICE AND SILICON CARBIDE SEMICONDUCTOR DEVICE

(71) Applicant: FUJI ELECTRIC CO., LTD., Kawasaki-shi, Kanagawa (JP)

(72) Inventor: Masayuki Miyazaki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/403,563

(22) Filed: Jan. 11, 2017

(65) Prior Publication Data
US 2017/0121850 A1     May 4, 2017

Related U.S. Application Data

(63) Continuation of application No. PCT/JP2015/085248, filed on Dec. 16, 2015.

(30) Foreign Application Priority Data

Feb. 2, 2015  (JP) .................................. 2015-018481

(51) Int. Cl.
H01L 21/20    (2006.01)
H01L 21/36    (2006.01)
(Continued)

(52) U.S. Cl.
CPC .......... C30B 33/005 (2013.01); B24B 37/042 (2013.01); B24B 37/10 (2013.01);
(Continued)

(58) Field of Classification Search
CPC ............ H01L 29/1608; H01L 21/0206; H01L 21/02236; H01L 21/02378; H01L 21/0262;
(Continued)

(56) References Cited

U.S. PATENT DOCUMENTS 7,037,838 B2    5/2006  Schowalter et al.
8,551,870 B2   10/2013  Schwandner et al.
(Continued)

FOREIGN PATENT DOCUMENTS

CN    102985601 A    3/2013
JP    2005-510072    4/2005
(Continued)

OTHER PUBLICATIONS

International Search Report dated Mar. 22, 2016 in corresponding International Application No. PCT/JP2015/085248.
(Continued)

*Primary Examiner* — Lex Malsawms
*Assistant Examiner* — Nduka Ojeh

(57) ABSTRACT

A method, for manufacturing a silicon carbide semiconductor device, includes: forming a silicon carbide epitaxial film on a silicon carbide substrate; flattening a surface of the epitaxial film by using chemical mechanical polishing such that the surface of the epitaxial film has an arithmetic mean roughness Ra of 0.3 nm or less; thermally oxidizing the surface of the epitaxial film to form a sacrificial oxide; removing the sacrificial oxide; and cleaning, by using deionized water, a surface of the epitaxial film exposed by the removing of the sacrificial oxide.

17 Claims, 5 Drawing Sheets

(51) Int. Cl.
*C30B 33/00* (2006.01)
*B24B 37/10* (2012.01)
*C30B 25/20* (2006.01)
*C30B 29/36* (2006.01)
*C30B 33/02* (2006.01)
*C30B 33/08* (2006.01)
*H01L 21/02* (2006.01)
*H01L 21/306* (2006.01)
*C23C 16/32* (2006.01)
*C23C 16/56* (2006.01)
*C30B 25/18* (2006.01)
*C30B 33/10* (2006.01)
*H01L 29/16* (2006.01)
*B24B 37/04* (2012.01)
*B24B 37/24* (2012.01)

(52) U.S. Cl.
CPC .......... *B24B 37/245* (2013.01); *C23C 16/325* (2013.01); *C23C 16/56* (2013.01); *C30B 25/186* (2013.01); *C30B 25/20* (2013.01); *C30B 29/36* (2013.01); *C30B 33/02* (2013.01); *C30B 33/08* (2013.01); *C30B 33/10* (2013.01); *H01L 21/0206* (2013.01); *H01L 21/0262* (2013.01); *H01L 21/02236* (2013.01); *H01L 21/02378* (2013.01); *H01L 21/02529* (2013.01); *H01L 21/30604* (2013.01); *H01L 21/30625* (2013.01); *H01L 29/1608* (2013.01); *H01L 21/02664* (2013.01)

(58) Field of Classification Search
CPC ......... H01L 21/02529; H01L 21/30625; H01L 21/0243; C30B 29/36; C30B 25/186; C30B 33/005; C30B 25/20; C30B 25/30; C30B 16/325; C30B 33/12; C30B 33/10
USPC ...... 257/77, E29.104, E21.09; 438/504, 478, 438/693, 692, 694
See application file for complete search history.

(56) References Cited

U.S. PATENT DOCUMENTS

| | | | |
|---|---|---|---|
| 2007/0290211 A1 | 12/2007 | Nakayama et al. | |
| 2011/0156058 A1 | 6/2011 | Hori et al. | |
| 2011/0291104 A1 | 12/2011 | McClure et al. | |
| 2011/0309376 A1* | 12/2011 | Hiyoshi | H01L 21/02043 257/77 |
| 2012/0223338 A1* | 9/2012 | Mitani | H01L 21/02178 257/77 |
| 2014/0220299 A1 | 8/2014 | Yoshida et al. | |
| 2016/0086799 A1* | 3/2016 | Hiyoshi | H01L 21/02378 257/77 |
| 2016/0197155 A1* | 7/2016 | Hiyoshi | H01L 21/02008 257/77 |
| 2017/0306526 A1* | 10/2017 | Okita | C30B 29/36 |

FOREIGN PATENT DOCUMENTS

| | | |
|---|---|---|
| JP | 2005-311348 | 11/2005 |
| JP | 2006-32655 | 2/2006 |
| JP | 2008-222509 | 9/2008 |
| JP | 2008-230944 | 10/2008 |
| JP | 2010-182782 | 8/2010 |
| JP | 2011-9661 | 1/2011 |
| JP | 2011-9746 | 1/2011 |
| JP | 2012-248859 | 12/2012 |
| JP | 2013-63891 | 4/2013 |
| WO | WO 2010/090024 A1 | 8/2010 |
| WO | WO 2013/051555 A1 | 4/2013 |

OTHER PUBLICATIONS

Chinese Office Action dated May 21, 2018 in corresponding Chinese Patent Application No. 201580039339.5.

* cited by examiner (A) EPITAXIAL FILM FORMATION (B) CHEMICAL MECHANICAL POLISHING (C) SACRIFICIAL OXIDE FORMATION (D) SACRIFICIAL OXIDE REMOVAL (E) CLEANING

METHOD FOR MANUFACTURING SILICON CARBIDE SEMICONDUCTOR DEVICE AND SILICON CARBIDE SEMICONDUCTOR DEVICE

CROSS-REFERENCE TO RELATED APPLICATIONS

This application is a continuation application, filed under 35 U.S.C. § 111(a), of International Application PCT/JP2015/085248 filed on Dec. 16, 2015 and claim foreign priority to Japanese Patent Application No. 2015-018481, filed Feb. 2, 2015 the content of each of which is incorporated herein by reference in its entirety.

BACKGROUND

1. Field

The present disclosure relates to a method for manufacturing a silicon carbide semiconductor device and the silicon carbide semiconductor device, and relates, in particular, to a method for reducing the number of defects of a silicon carbide epitaxial film formed on a silicon carbide substrate.

2. Related Art

Although conventional power semiconductor devices have been formed on a silicon substrate, silicon material has approached a physical limit in performance properties. Attention has focused on silicon carbide (SiC) semiconductor devices, in which a substrate has excellent breakdown electric field strength, holding low power loss capability, and exercising excellent performance in high temperature condition and also in high frequency operation. With regard to the SiC semiconductor device, a device structure is generally fabricated as follows: a SiC epitaxial film is formed on a SiC substrate being a primary substrate with low resistance, and processes such as implanting impurity ions are successively performed on the SiC epitaxial film.

There are many polytypes (crystal polymorphism) such as 2H—SiC, 3C—SiC, 4H—SiC, 6H—SiC, 15R—SiC based upon a periodic structure difference when Si and C are bonded to form SiC. Then, there is a problem that a mismatch can be easily created during crystal growth. Therefore when a SiC single crystal is prepared, different polytypes are inevitably mixed in the crystal, resulting in the existence of multiple crystal defects such as dislocations caused by crystal mismatching. When the SiC epitaxial film is deposited on the SiC substrate, threading screw dislocations and threading edge dislocations may propagate, with just the geometry as they are or with conversion into basal plane dislocations and carrot defects, to the epitaxial film, producing defects in the epitaxial film.

The epitaxial film also has defects created from other causes not depending on the primary substrate. There are defects such as, for example, step bunching which occurs during film deposition and further so-called downfall defects produced when particles are attached to the wafer surface during epitaxial growth.

If a crystal defect may exists in the SiC epitaxial film, the manufactured SiC semiconductor device may cause abnormality in leak current and breakdown voltage failure, resulting in low yield of the product.

Patent Literatures 1 through 5 listed below disclose methods for reducing defects so that the methods are carried out on the SiC substrate surface before forming the epitaxial film. Further, in Patent Literature 6 listed below, a method for reducing defects in the epitaxial film is disclosed so that the SiC epitaxial film formed on the SiC substrate is heated to become up to 1 nm or more in surface roughness Ra of the epitaxial film and then flattened to become less than 0.5 nm in Ra.

Patent Literature 1: Japanese Patent Application LAID-Open No. 2005-311348
Patent Literature 2: JP-A 2006-032655
Patent Literature 3: JP-A 2008-230944
Patent Literature 4: JP-A 2010-182782
Patent Literature 5: WO 2010/090024
Patent Literature 6: JP-A 2008-222509

SUMMARY

There is, however, a problem in that epitaxial film defects not depending on a primary substrate cannot be removed in the method described in Patent Literatures 1 through 5. There is another problem in that step bunching may occur as a side effect in the method described in Patent Literature 6.

An aspect of the present disclosure is to provide a method for manufacturing a silicon carbide semiconductor device whereby the method can decrease defects created in a silicon carbide epitaxial film and, furthermore, the silicon carbide semiconductor device obtained by the method.

In order to attain the benefits described above, one aspect of the present disclosure is a method for manufacturing a silicon carbide semiconductor device, comprising the steps of: forming an epitaxial film composed of silicon carbide on a silicon carbide substrate as a step (A); flattening a surface of the epitaxial film by using chemical mechanical polishing up to 0.3 nm or less in arithmetic mean roughness Ra as a step (B); oxidizing the surface of the epitaxial film thermally to form a sacrificial oxide as a step (C); removing the sacrificial oxide as a step (D); and cleaning another epitaxial film surface which appears after the sacrificial oxide has been removed with deionized water as a step (E).

According to the above aspect of the present disclosure, defects created during the epitaxial film growth may be removed, and additionally working damage produced during chemical mechanical polishing can be eliminated with the sacrificed oxide.

In the method for manufacturing the silicon carbide semiconductor device according to the present disclosure, the silicon carbide substrate used in the step (A) is preferably flattened by using chemical mechanical polishing to be equal to or less than 1 nm in arithmetic mean roughness Ra.

According to the above aspect on the disclosure, as defects exposing to the surface of the SiC substrate can be removed before depositing the epitaxial film, the number of defects generated from crystal defects having starting point in the silicon carbide substrate may be reduced in the epitaxial film.

In the method for manufacturing the silicon carbide semiconductor device according to the present disclosure, it is preferable that polishing amount is equal to or more than 0.3 μm and equal to or less than 1 μm with regard to the epitaxial film in the step (B).

According to the above aspect of the disclosure, in particular, pit-like defects, which account for a vast majority of the defects, can be removed in the epitaxial film.

In the method for manufacturing the silicon carbide semiconductor device according to the present disclosure, the sacrificial oxide is preferably equal to or more than 20 nm and equal to or less than 100 nm in thickness in the step (C).

According to the above aspect of the disclosure, the working damage generated during chemical mechanical polishing may be removed.

In the method for manufacturing the silicon carbide semiconductor device according to the present disclosure, a temperature is preferably equal to or more than 800° C. and equal to or less than 1350° C. when the sacrificial oxide is formed in the step (C).

According to the above aspect of the disclosure, the sacrificial oxide can be controlled precisely in thickness.

In the method for manufacturing the silicon carbide semiconductor device according to the present disclosure, the sacrificial oxide is preferably removed by using aqueous solution including hydrofluoric acid in the step (D).

According to the above aspect of the disclosure, as the sacrificial oxide can be removed selectively with respect to the silicon carbide epitaxial layer, surface roughness can be maintained as smooth as that before forming the sacrificial oxide in the epitaxial layer.

According to another aspect of the present disclosure, a silicon carbide semiconductor device preferably comprises a part manufactured by employing any one of the methods described above.

As the number of defects may is reduced in the epitaxial film, the silicon carbide semiconductor device having excellent reliability and electric properties can be produced with a high yield.

According to the present disclosure, defects created during an epitaxial film growth can be removed by chemical mechanical polishing, and the working damage generated during chemical mechanical polishing can be removed with the sacrificial oxide. As the number of defects may reduce in the epitaxial film, the silicon carbide semiconductor device having excellent reliability and electric properties can be produced with a high yield.

DESCRIPTION OF EMBODIMENTS

A method for manufacturing a SiC semiconductor device according to the present disclosure comprises the steps of: forming a SiC epitaxial film as a step (A), performing a chemical mechanical polishing process as a step (B), forming a sacrificial oxide as a step (C), removing the sacrificial oxide as a step (D), and cleaning an epitaxial film surface as a step (E), wherein the manufacturing process is configured of the steps in order as described above.

However, other steps may be inserted before and after any one of the steps described above. For example, if another chemical mechanical polishing process is inserted before the step (A), flatness can be improved for the SiC substrate. In another case, if a reactive plasma irradiation step is inserted before the step (A), a surface can be cleaned on the SiC substrate. Further, abrasives adhered to the surface of the SiC epitaxial film can be eliminated therefrom when a scrubber cleaning step is inserted after the step (B).

Figure 1:
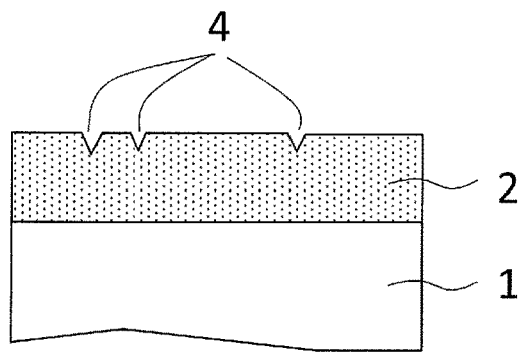
FIG. 1 illustrates a process chart showing a method for manufacturing a SiC semiconductor device according to one embodiment of the present disclosure.
Figure 1:
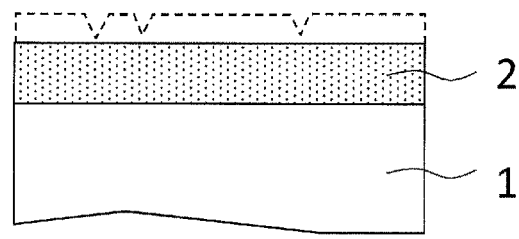
Figure 1:
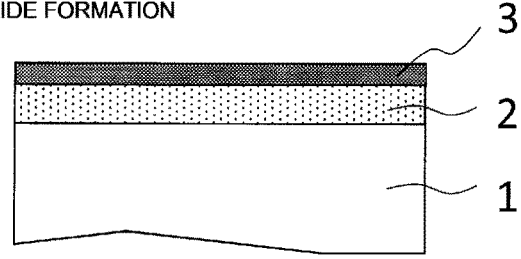
Figure 1:
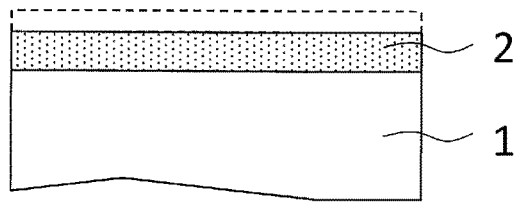
Figure 1:
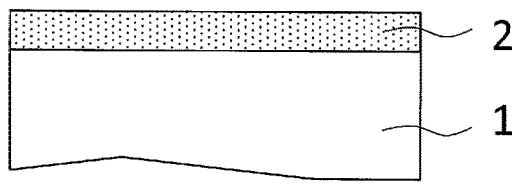

FIG. 1 illustrates the schematic process flow described above. The figure shows that: a SiC epitaxial film 2 is deposited on a SiC substrate 1 in the step (A), the SiC epitaxial film 2 is processed by chemical mechanical polishing in the step (B), a sacrificial oxide 3 is formed in the step (C), the sacrificial oxide 3 is removed in the step (D), and cleaning is performed with deionized water (DIW). A defect 4 is removed by chemical mechanical polishing in the step (B).

SiC Substrate

The SiC substrate employed in the present disclosure is not limited to any particular example. A sliced substrate of bulk crystal, for example, formed by sublimation or by chemical vapor deposition can be employed therefor.

The polytype of the SiC single crystal is not limited to any particular example, and may be of types such as 4H—SiC, 6H—SiC, 3C—SiC, and the like. Preferably, 4H—SiC is used for a power semiconductor device because it has excellent properties in breakdown voltage and carrier mobility. The principal surface of the substrate, on which epitaxial growth is performed, is not limited to any particular example and can be chosen from any one of 4H—SiC(0001)Si-face, 4H—SiC(000-1)C-face and the like.

Moreover, in order to prevent another polytype from mixing into the one polytype during the epitaxial growth, it is preferable for a substrate to have an off-angle of 1 to 12° with respect to the [0001] direction. More preferably, the substrate may be cut off with a slope of 4° or 8° in off-angle.

Furthermore, it is preferable that the surface of the SiC substrate is flattened so that the arithmetic mean roughness Ra of the SiC substrate is equal to or less than 1 nm. For example, the surface of the SiC substrate can be processed by chemical mechanical polishing before forming the SiC epitaxial film. The number of defects propagating from the SiC substrate surface to the SiC epitaxial film can be reduced according to the embodiment described above.

Formation of SiC Epitaxial Film

The method for depositing the SiC epitaxial film is not limited to any particular example. The film can be formed by using epitaxy methods such as low pressure CVD and atmospheric pressure CVD.

With regard to raw materials, gases such as monosilane, dichlorosilane, and the like can be used as a Si supply source, and another gas(es) such as propane and methane, and the like can be used as a C supply source. Further, an n-type dopant gas such as nitrogen or ammonia, for example, and a p-type dopant gas such as trimethylaluminum or the like may be added. Furthermore, a carrier gas such as hydrogen or argon, for example, can be used when diluting the gases described above.

During CVD, it is preferable for the CVD to be performed at a temperature equal to or more than 1400° C. and equal to or less than 1800° C. More preferably, the temperature is equal to or more than 1500° C. and equal to or less than 1750° C. It is not preferable that a deposition rate is slow when the temperature is less than 1500° C. and also a surface defect may occur when the temperature is more than 1750° C. In the case of low pressure CVD, it is preferable that a pressure while operating CVD is equal to or more than 0 Pa and equal to or less than 20 Pa. More preferably, the pressure is equal to or more than 1 Pa and equal to or less than 15 Pa.

A CVD apparatus for depositing the SiC epitaxial film is not limited to any particular example and may be of a type having a hot wall formed of graphite in a dual circular tube with water cooling system and heating the hot wall with an induction coil, or the like.

In addition, a surface of the SiC substrate may be etched by using a kind of gas as a pretreatment before the SiC epitaxial film is formed. For example, when gaseous hydrogen chloride comes into contact with SiC substrate heated up to equal to or more than 1000° C., the SiC surface can be etched to reduce surface defects.

Chemical Mechanical Polishing

According to the present disclosure, processing chemical mechanical polishing allows the SiC epitaxial film to become flattened so that the arithmetic mean roughness Ra of the SiC epitaxial film is equal to or less than 0.3 nm. If the arithmetic mean roughness Ra is more than 0.3 nm, a gate oxide formed on the SiC epitaxial film may have many pinholes and interface states, which are not preferable because deterioration in reliability and device performances may occur.

Further, a polishing amount of the SiC epitaxial film is preferably equal to or more than 0.3 µm and equal to or less than 1 µm. If the film is polished as described above, the defects of the SiC epitaxial film can be eliminated, particularly pit-like defects which cover a major part of the defects.

The method for processing chemical mechanical polishing with regard to the SiC epitaxial film is not limited to any particular example and may be implemented in ways such as by using a fixed abrasive, by employing both a soft polishing pad and an abrasive solution, or by applying treatment by the fixed abrasive followed by the soft polishing pad and the abrasive solution. The polishing pad and the abrasive solution may be available commercially.

Formation of Sacrificial Oxide

According to the present disclosure, for purposes of removing process damage introduced to the SiC epitaxial film while processing chemical mechanical polishing, oxidizing the surface of the SiC epitaxial film thermally is useful to form the sacrificial oxide in the range of being equal to or more than 20 nm and equal to or less than 100 nm in thickness. "Process damage" described above indicates micro flaws, crystal lattice fluctuation, and adhered particles produced when the surface of the SiC epitaxial film is scratched by abrasives and the polishing pad. These kinds of process damages are eliminated by being absorbed in the sacrificial oxide formed in the manner discussed in this disclosure or by being decomposed to sublime. Thus, forming the sacrificial oxide allows excellent crystal properties of the SiC epitaxial film to remain under the sacrificial oxide.

The method for forming the sacrificial oxide is not limited to any particular example. One suitable method is to employ a wet oxidation process which distributes oxidizing gases having water vapor or a dry oxidation process which distributes oxidizing gases having dry oxygen, for example, in the range of being equal to or more than 800° C. and equal to or less than 1350° C. On this occasion, for purposes of removing metal pollution actively, gases having a halogen element (such as hydrogen chloride) may be mixed with the oxidizing gases described above.

Moreover, before thermal oxidation, a washing process may be applied to the SiC epitaxial film by using one or more kinds of solutions, such as a mixed solution with aqueous ammonia and hydrogen peroxide, a mixed solution with hydrochloric acid and hydrogen peroxide, and/or a solution with hydrofluoric acid. When the process has been performed as described above, the SiC epitaxial film can be oxidized while maintaining a state in which organic and metallic pollution is minimized.

Removing Sacrificial Oxide

Because the sacrificial oxide is formed while absorbing defects of the SiC epitaxial film and has a lot of pinholes and trap levels, it is not preferable that the sacrificial oxide is used for the purpose of gate insulation or isolation. Therefore, according to the present disclosure, the sacrificial oxide formed by oxidizing the SiC epitaxial film thermally can be removed selectively by being dipped into, for example, an aqueous solution including hydrofluoric acid. As SiC does not dissolve in hydrofluoric acid, a smooth surface can be maintained similar to that before formation of sacrificial oxidation. A gate dielectric film can be formed with high quality on the smooth surface.

Cleaning

According to the present disclosure, the substrate is rinsed with running water using deionized water (DIW) after removing the sacrificial oxide and dried in the following to obtain a clean surface. A method for drying the substrate is not limited to a particular example, and may be a spin drier, an isopropanol vapor drier, and the like.

Manufacturing of SiC Semiconductor Device

A SiC semiconductor device can be manufactured by employing a SiC substrate having the SiC epitaxial film with smaller defects in number, which is obtained through the above mentioned process.

The SiC semiconductor device manufactured as described above has a gate dielectric film in which there are no pinholes and smaller interface states. Therefore, the device can exert outstanding reliability and performance, the device having an excellent dielectric breakdown voltage, a lower leak current, and a higher saturation current.

EXAMPLES

Example

A surface of a SiC substrate having a polytype of 4H—SiC and an off-angle of 4° was processed by using chemical mechanical polishing, and the arithmetic mean roughness Ra determined by an atomic force microscope. Next a SiC epitaxial film having a 10 µm thickness was deposited by using low pressure CVD, and then the SiC epitaxial film was processed by chemical mechanical polishing to remove a surface portion by 50 nm in depth. Then a defect map was acquired by using a surface defect inspection apparatus with a confocal microscope. In addition, the arithmetic mean roughness Ra was determined for the SiC epitaxial film by using the atomic force microscope.

Comparative Example

The surface of another SiC substrate having the polytype of 4H—SiC and the off-angle of 4° was processed by using chemical mechanical polishing, and the arithmetic mean roughness Ra determined by using the atomic force microscope. Next another SiC epitaxial film having a 10 µm thickness was deposited by using low pressure CVD, and then another defect map was acquired by using the surface defect inspection apparatus with the confocal microscope. In addition, the arithmetic mean roughness Ra was determined for the SiC epitaxial film by using the atomic force microscope.

Figure 2:
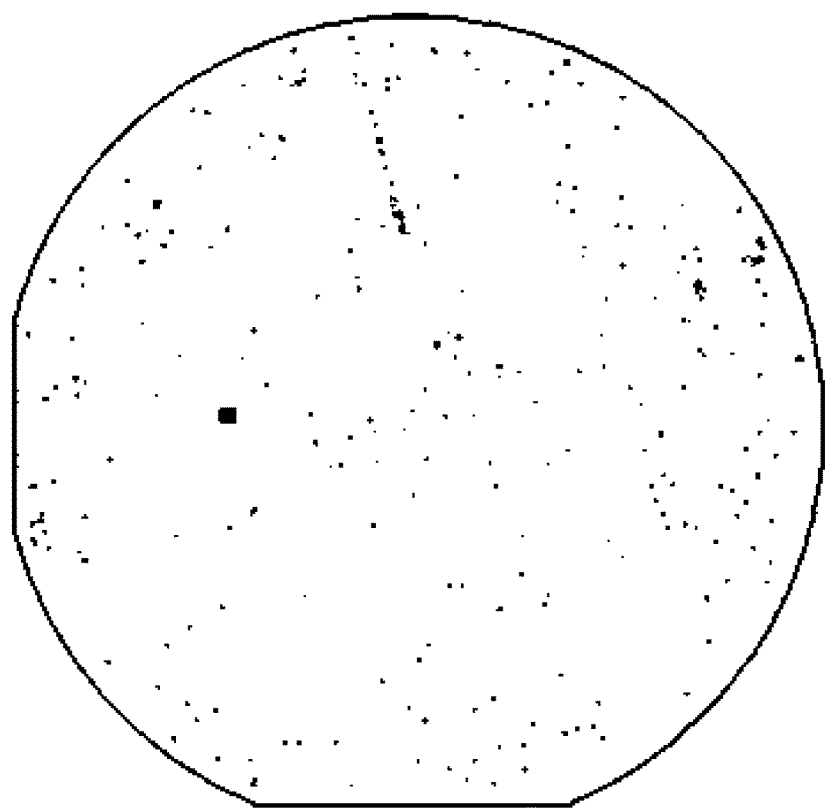
FIG. 2 illustrates a defect map with regard to the SiC epitaxial film according to an example of the present disclosure.
Figure 3:
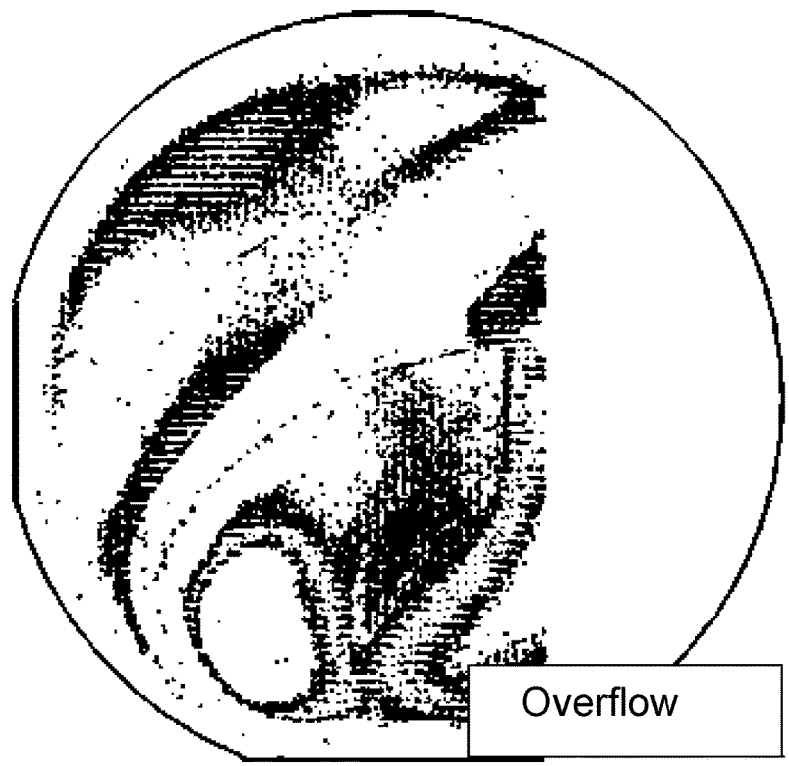
FIG. 3 illustrates another defect map with regard to the SiC epitaxial film according to a comparative example.

FIGS. 2 and 3 show defect maps acquired as described above. Defects in the SiC epitaxial film are illustrated with black spots. The example (see FIG. 2) in which chemical mechanical polishing was achieved after the SiC epitaxial film formation indicates a result that defects are dramatically reduced on the contrary of the comparative example (see FIG. 3) in which chemical mechanical polishing was not achieved.

Figure 4:
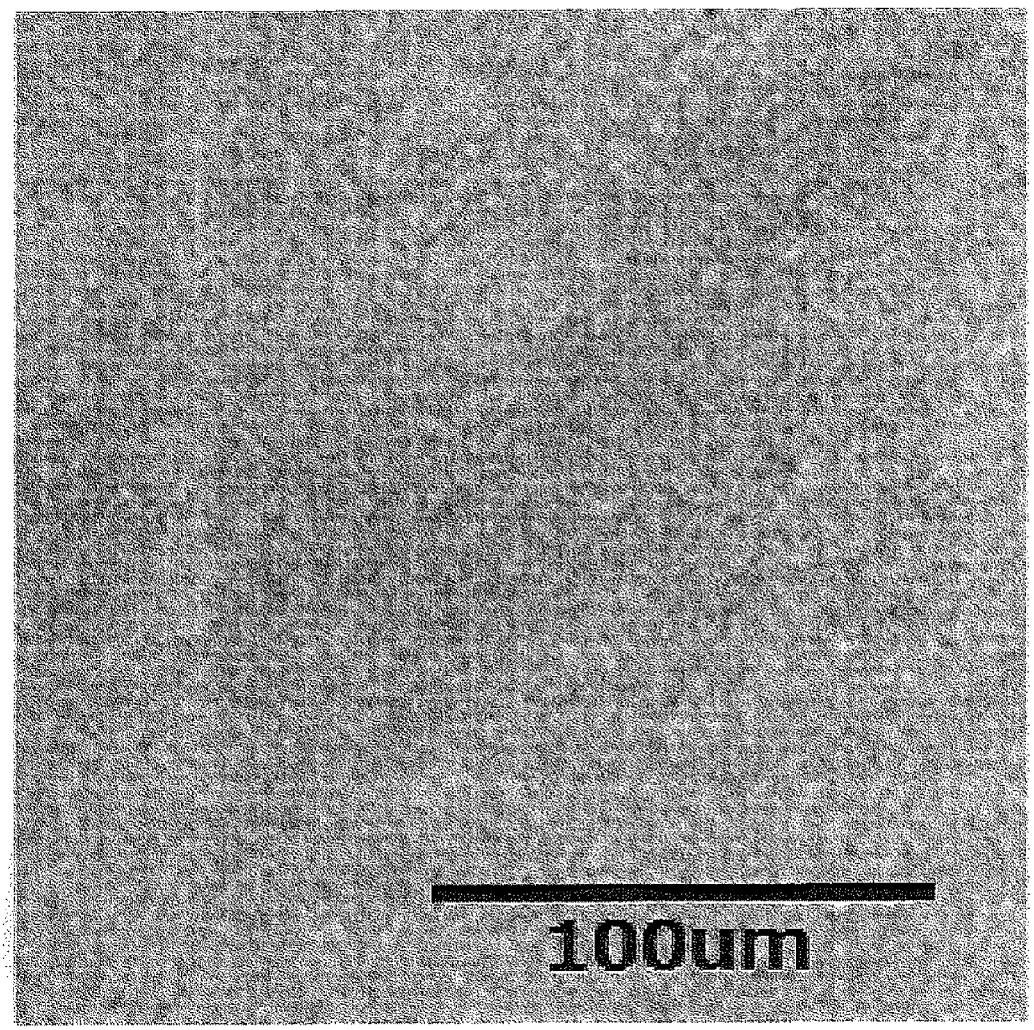
FIG. 4 illustrates a picture of atomic force microscope with regard to the SiC epitaxial film surface according to the example of the present disclosure.
Figure 5:
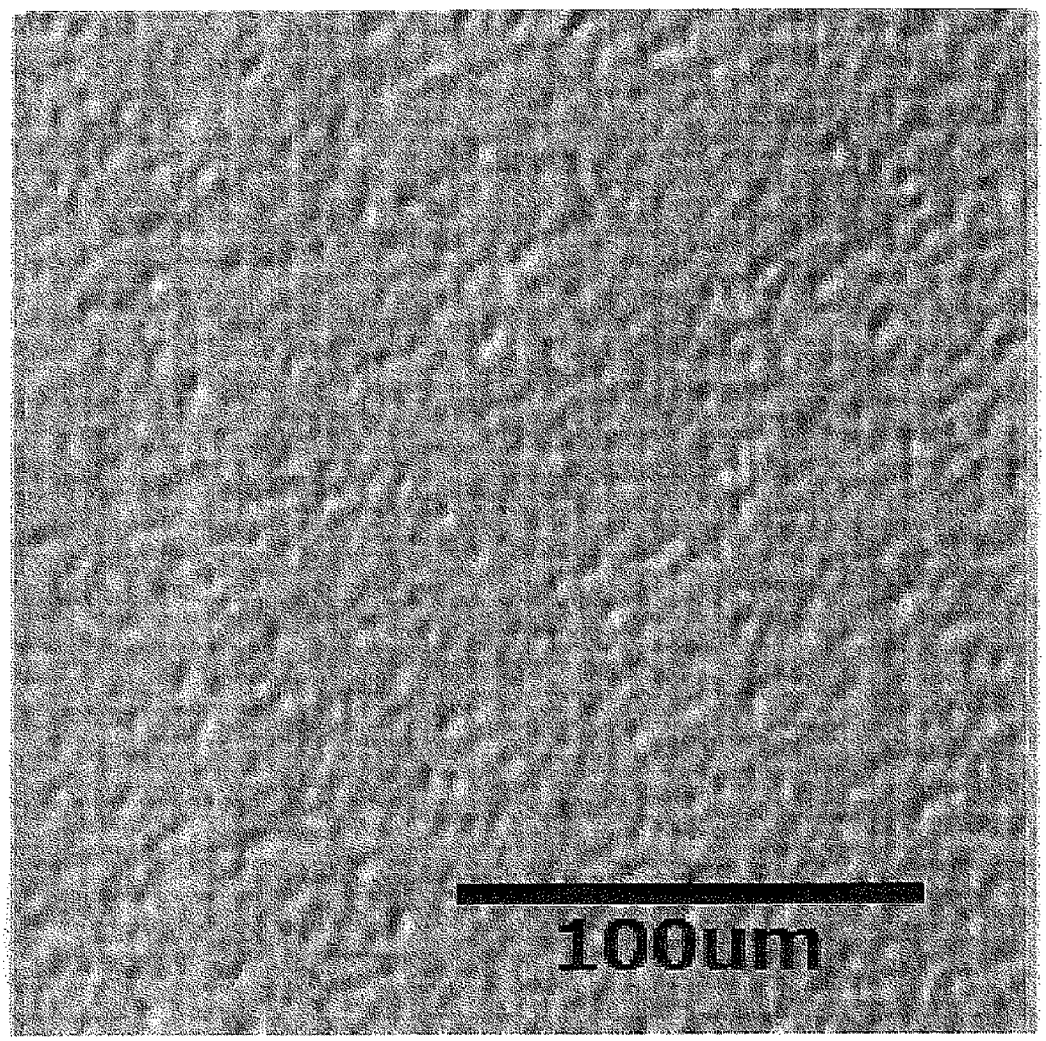
FIG. 5 illustrates another picture of atomic force microscope with regard to the SiC epitaxial film surface according to the comparative example.

FIGS. 4 and 5 show visual imaginaries illustrating projections and depressions created on the SiC epitaxial film surface, which has been determined by the atomic force microscope. In the comparative example (see FIG. 5), Ra is 1.0 nm in the case of no chemical mechanical polishing process after the SiC epitaxial film formation. However, in the example (see FIG. 4), Ra is reduced to 0.254 nm, which realizes a target value being less than 0.3 nm.

Inclusion in this disclosure of any characterization of any product or method of the related art does not imply or admit that such characterization was known in the prior art or that such characterization would have been appreciated by one of ordinary skill in the art at the time a claimed was made, even if the product or method itself was known in the prior art at the time of invention of the present disclosure. For example, if a related art document discussed in the foregoing sections of this disclosure constitutes statutory prior art, the inclusion of any characterization of the related art document does not imply or admit that such characterization of the related art document was known in the prior art or would have been appreciated by one of ordinary skill in the art at the time a claimed invention was made, especially if the characterization is not disclosed in the related art document itself.

While the present disclosure has been particularly shown and described with reference to the embodiments thereof, it will be understood by those skilled in the art that the foregoing and other changes in form and details can be made therein without departing from the spirit and scope of the present disclosure.

Reference signs and numerals are as follows:
1 SiC substrate
2 SiC epitaxial film
3 sacrificial oxide
4 defect

What is claimed is:

1. A method for manufacturing a silicon carbide semiconductor device, comprising:
   forming a silicon carbide epitaxial film on a silicon carbide substrate;
   flattening a surface of the epitaxial film by using chemical mechanical polishing to thereby obtain a flattened surface, of the epitaxial film, having an arithmetic mean roughness Ra of 0.3 nm or less;
   thermally oxidizing the flattened surface of the epitaxial film to form a sacrificial oxide;
   removing the sacrificial oxide; and
   cleaning, by using deionized water, a surface of the epitaxial film exposed by the removing of the sacrificial oxide,
   wherein the forming, the flattening, the thermally oxidizing, and the removing are performed sequentially without any intervening processing operations.

2. The method for manufacturing the silicon carbide semiconductor device according to claim 1, wherein in the forming the silicon carbide epitaxial film, the epitaxial film is formed on a surface, of the silicon carbide substrate, having an arithmetic mean roughness Ra equal to or less than 1 nm.

3. The method for manufacturing the silicon carbide semiconductor device according to claim 2, further comprising:
   performing chemical mechanical polishing on the silicon carbide substrate to thereby obtain the surface having the roughness Ra equal to or less than 1 nm, prior to the forming the silicon carbide epitaxial film.

4. The method for manufacturing the silicon carbide semiconductor device according to claim 1, wherein in the flattening a surface of the epitaxial film, a polishing amount performed on the epitaxial film is equal to or more than 0.3 μm and equal to or less than 1 μm.

5. The method for manufacturing the silicon carbide semiconductor device according to claim 1, wherein the sacrificial oxide formed by the oxidizing has a thickness equal to or more than 20 nm and equal to or less than 100 nm.

6. The method for manufacturing the silicon carbide semiconductor device according to claim 1, wherein the oxidizing to form the sacrificial oxide is performed at a temperature equal to or more than 800° C. and equal to or less than 1350° C.

7. The method for manufacturing the silicon carbide semiconductor device according to claim 1, wherein the removing the sacrificial oxide is performed by using an aqueous solution including hydrofluoric acid.

8. The method for manufacturing the silicon carbide semiconductor device according to claim 1, further comprising:
   forming a gate dielectric film on the surface of the epitaxial film exposed by the removing of the sacrificial oxide.

9. A silicon carbide semiconductor device comprising a part manufactured by employing the method according to claim 1.

10. A silicon carbide semiconductor device comprising a part manufactured by employing the method according to claim 2.

11. A silicon carbide semiconductor device comprising a part manufactured by employing the method according to claim 3.

12. A silicon carbide semiconductor device comprising a part manufactured by employing the method according to claim 4.

13. A silicon carbide semiconductor device comprising a part manufactured by employing the method according to claim 5.

14. A silicon carbide semiconductor device comprising a part manufactured by employing the method according to claim 6.

15. A silicon carbide semiconductor device comprising a part manufactured by employing the method according to claim 7.

16. A silicon carbide semiconductor device comprising a part manufactured by employing the method according to claim 8.

17. The method for manufacturing the silicon carbide semiconductor device according to claim 1, wherein the thermally oxidizing and the removing the sacrificial oxide remove a process damage produced by the chemical mechanical polishing, the process damage being micro flaws, crystal lattice fluctuation, or adhered particles produced by the chemical mechanical polishing.

* * * * *